(12) United States Patent
Swan et al.

(10) Patent No.: US 11,101,205 B2
(45) Date of Patent: Aug. 24, 2021

(54) INTERCONNECTION STRUCTURE FABRICATION USING GRAYSCALE LITHOGRAPHY

(71) Applicant: Intel Corporation, Santa Clara, CA (US)

(72) Inventors: Johanna Swan, Scottsdale, AZ (US); Henning Braunisch, Phoenix, AZ (US); Aleksandar Aleksov, Chandler, AZ (US); Shawna Liff, Scottsdale, AZ (US); Brandon Rawlings, Chandler, AZ (US); Veronica Strong, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/564,168

(22) Filed: Sep. 9, 2019

(65) Prior Publication Data

US 2021/0074620 A1 Mar. 11, 2021

(51) Int. Cl.
*H01L 23/498* (2006.01)
*G03F 1/38* (2012.01)
*G03F 1/54* (2012.01)
*G03F 1/68* (2012.01)

(52) U.S. Cl.
CPC ......... *H01L 23/49838* (2013.01); *G03F 1/38* (2013.01); *G03F 1/54* (2013.01); *G03F 1/68* (2013.01); *H01L 23/49827* (2013.01); *H01L 23/49866* (2013.01)

(58) Field of Classification Search
CPC ......... H01L 23/49838; H01L 23/49866; H01L 23/49827; G03F 1/54; G03F 1/38; G03F 1/68
See application file for complete search history.

(56) References Cited

U.S. PATENT DOCUMENTS

| | | | |
|---|---|---|---|
| 6,870,707 B1 * | 3/2005 | Zheng | G11B 5/6005 360/235.6 |
| 10,187,998 B2 | 1/2019 | Rawlings et al. | |
| 10,571,861 B2 * | 2/2020 | Menon | H01L 21/30604 |
| 2009/0023098 A1 * | 1/2009 | Jain | H01L 21/76807 430/296 |
| 2009/0104540 A1 * | 4/2009 | Burgess | G03F 1/32 430/5 |

(Continued)

*Primary Examiner* — Galina G Yushina
(74) *Attorney, Agent, or Firm* — Green, Howard & Mughal LLP.; Robert G. Winkle

(57) ABSTRACT

An lithographic reticle may be formed comprising a transparent substrate, a substantially opaque mask formed on the transparent substrate that defines at least one exposure window, wherein the at least one exposure window has a first end, a first filter formed on the transparent substrate within the at least one exposure window and abutting the first end thereof, and a second filter formed on the transparent substrate within the at least one exposure window and abutting the first filter, wherein an average transmissivity of the first filter is substantially one half of a transmissivity of the second filter. In another embodiment, the at least one exposure window includes a third filter abutting the second end and is adjacent the second filter. Further embodiments of the present description include interconnection structures and systems fabricated using the lithographic reticle.

8 Claims, 11 Drawing Sheets

(56) References Cited

U.S. PATENT DOCUMENTS

| | | | |
|---|---|---|---|
| 2011/0090477 A1* | 4/2011 | Haga | G03F 7/704 355/67 |
| 2012/0018875 A1* | 1/2012 | Yang | H01L 23/3171 257/737 |
| 2018/0164675 A1* | 6/2018 | Chang | G03F 1/30 |
| 2019/0072696 A1* | 3/2019 | Li | H01L 27/1288 |

* cited by examiner

INTERCONNECTION STRUCTURE FABRICATION USING GRAYSCALE LITHOGRAPHY

TECHNICAL FIELD

Embodiments of the present description generally relate to the field of integrated circuit package or device fabrication, and, more specifically, to the fabrication of interconnection structures using grayscale lithography.

BACKGROUND

The integrated circuit industry is continually striving to produce ever faster, smaller, and thinner integrated circuit packages for use in various electronic products, including, but not limited to, computer servers and portable products, such as portable computers, electronic tablets, cellular phones, digital cameras, and the like.

As a part of this effort, the integrated circuit industry has developed innovative interposers to address the requirements for higher performance and smaller form factor integrated circuit packages. These interposers provide conductive routes between multiple integrated circuit devices within the integrated circuit packages and to external attachment structures, such as solder ball interconnects, formed on the integrated circuit packages. Generally, the interposer comprises a plurality of conductive traces separated by dielectric layers, wherein conductive vias are formed through the dielectric layers to electrically connect the conductive traces. A step and repeat (stepper) lithography process is generally used to form the conductive traces and conductive vias. However, for some designs the interposer area can exceed the maximum stepper field size or the size of available reticles.

To overcome this issue, a pattern for an interposer may be decomposed into two or more sub-patterns reproduced on separate reticles, and exposure stitching may be used to stitch together patterns on multiple reticles if the exposed areas overlap and the overlapped regions are complementary. Exposure stitching, also known as reticle stitching, is well known in the art and will not be described in detail for purposes of clarity and conciseness. One issue with exposure stitching is that the exposure images (reticles) for two or more sub-exposures are precisely overlapped or abutted, and the total exposure image is the linear superposition of the two or more individual sub-exposure images. Therefore, regions that overlap between the two sub-exposure images may be exposed at twice the exposure dose.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
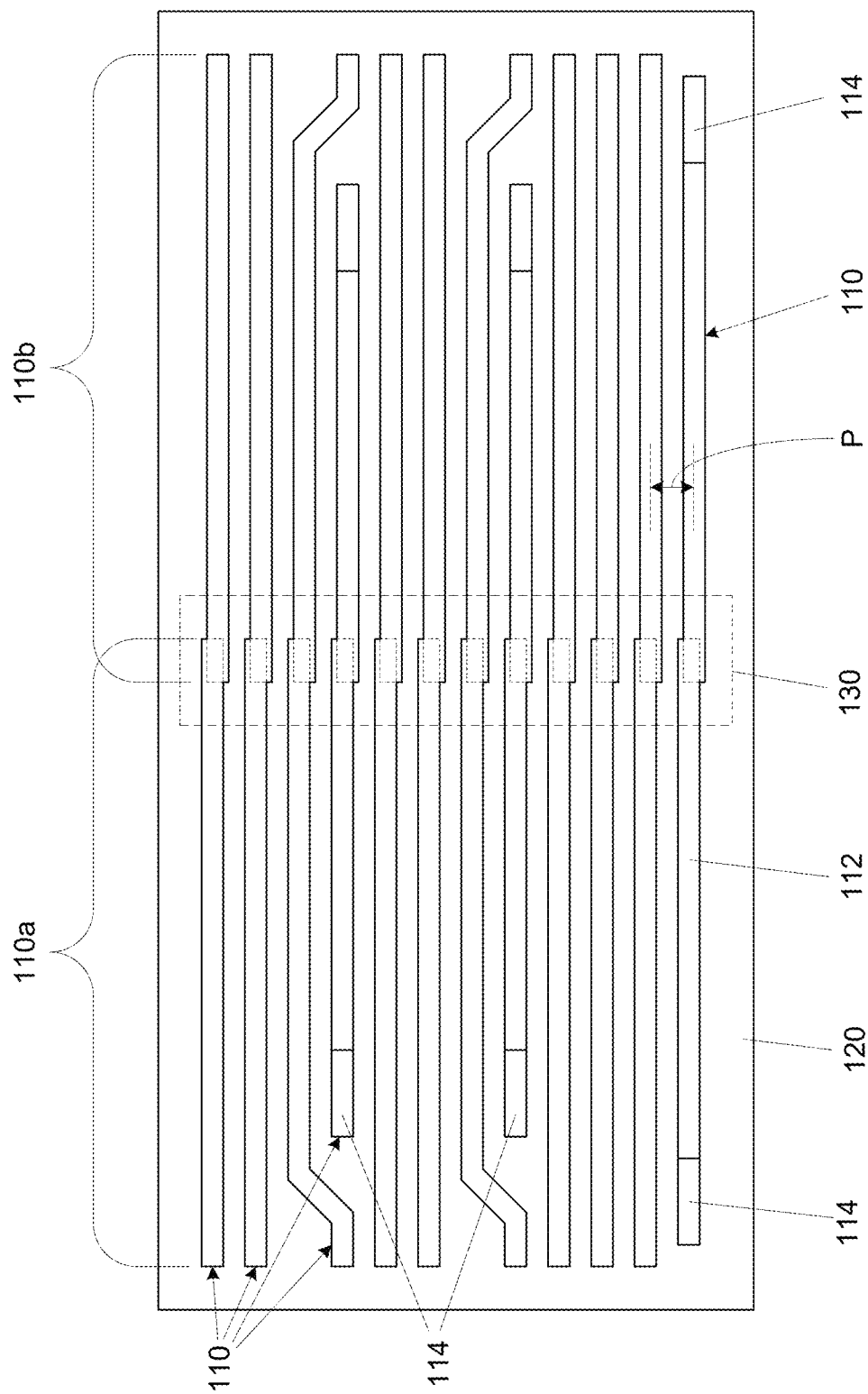
FIG. 1 is a top plan view of a plurality of interconnection structures, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" or "interposer" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

The term "transmissivity" as used within the context of the present description is defined to mean the degree to which a medium, such as a filter, allows something, such as light, to pass through it.

The embodiments of the present description relate to lithographic reticles that will allow for more effective exposure stitching. Further embodiments include the formation of an interconnection structure having a conductive trace portion and at least one via portion during the exposure stitching process. In one embodiment, an lithographic reticle may be formed comprising a transparent substrate, a substantially opaque mask formed on the transparent substrate that defines at least one exposure window, wherein the at least one exposure window has a first end, a first filter formed on the transparent substrate within the at least one exposure window and abutting the first end thereof, and a second filter formed on the transparent substrate within the at least one exposure window and abutting the first filter, wherein an average transmissivity of the first filter is less than 90% of a transmissivity of the second filter. In one embodiment, the average transmissivity of the first filter is substantially one half a transmissivity of the second filter. In another embodiment, the at least one exposure window includes a third filter abutting the second end and is adjacent the second filter. Further embodiments of the present description include interconnection structures and systems fabricated using the lithographic reticle.

Lithography, as it is used to fabricate integrated circuit devices, is well known in the art, and for the purposes of clarity and conciseness will not be discussed in detail herein. As will be understood to those skilled in the art, during the lithography processes used to fabricate an integrated circuit device, if the total area thereof is larger than what can be patterned using a single reticle, the pattern may be subdivided into two or more sub-reticles which are stitched by alignment of the lithographic exposures the define their locations. FIG. 1 illustrates a plurality of interconnection structures or conductive routes 110 formed on an electronic substrate 120 by two lithographic exposures using two lithographic reticles. Thus, first portions 110a of each of the interconnection structures 110 may be formed on the left side of FIG. 1 with a first reticle (not shown) and second portions 110b of each of the interconnection structures 110 may be formed on the right side of FIG. 1 with a second lithographic reticle (not shown). The first portions 110a and their corresponding second portion 110b may come into physical contact (e.g. precisely abut or overlap) within a stitch region 130. FIG. 1 shows a region containing relatively dense routing of connected interconnection structures 110 (110a/110b) and the stitch boundary or region 130. As will be understood to those skilled in the art, the stitch region 130 may be identified by a misalignment between the first portion 110a and the second portion 110b of the interconnection structures 110 due to potential misalignment of the first lithographic reticle (not shown) and the second lithographic reticle (not shown) during the processing steps. An average pitch P (e.g. average centerline-to-centerline distance between interconnection structures 110) determines the number of connections across a boundary, which may be defined by the outline or edge of an integrated circuit device, as will be understood by those skilled in the art. In a multi-device integrated circuit package or interposer, the average pitch P between the interconnection structures can vary across its area. While it is not always necessary to locate the stitch region 130 at the highest trace density, the embodiments of the present description support that possibility and thus increases design flexibility. At least one of the interconnection structures 110 may include at least one via portion 114 (i.e. the portion of the interconnection structure 110 that electrically connects interconnection structures 110 in a vertical direction) with the remainder being a trace portion 112.

In one embodiment, the electronic substrate 120 may be any appropriate dielectric material, including, but not limited to, bismaleimide triazine resin, fire retardant grade 4 material, polyimide material, silica filled epoxy material, glass reinforced epoxy material, as well as laminates or multiple layers thereof, and the like. In an embodiment, the electronic substrate 120 may be an organic substrate. In a further embodiment, the electronic substrate 120 may include inorganic fillers. In one embodiment, the electronic substrate 120 may be formed from low-k and ultra low-k dielectrics (dielectric constants less than about 3.6), including, but not limited to, carbon doped dielectrics, fluorine doped dielectrics, porous dielectrics, organic polymeric dielectrics, and the like. In an embodiment, the electronic substrate 120 may be an integrated circuit device or a package substrate, including but not limited to a semiconductor, a multi-chip package substrate, a system-in-package substrate, and an interposer substrate.

The interconnection structures 110 may be made of any appropriate conductive material, including but not limited to, metals, such as copper, silver, nickel, gold, tungsten, tantalum, titanium, hafnium, zirconium, tin, and aluminum, alloys thereof, carbides thereof, and combinations thereof. In a specific embodiment, the interconnection structures 110 may be copper.

As will be understood to those skilled in the art, in traditional lithography, exposure image areas are binary, wherein areas masked by the reticle receive substantially no exposure at all and areas not masked by the reticle (i.e. through apertures therein) receive a specific fixed amount of light for the exposure dose. Therefore, any overlap within the stitch region 130 regions are exposed to twice the exposure dose. For development processes, which are sensitive to amounts of light exceeding the exposure dose, the overlap effect is particularly deleterious because the overexposed region may develop in an unintended fashion.

Figure 2:
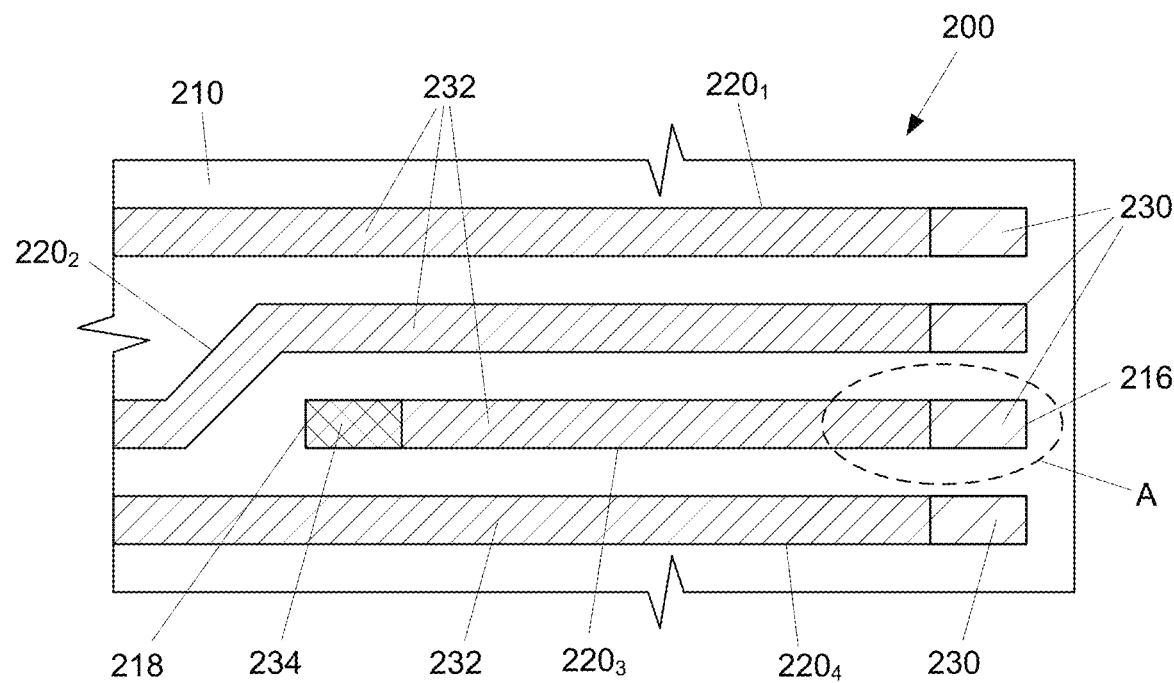
FIG. 2 is a top plan view of a lithographic reticle, according to one embodiment of the present description.
Figure 3:
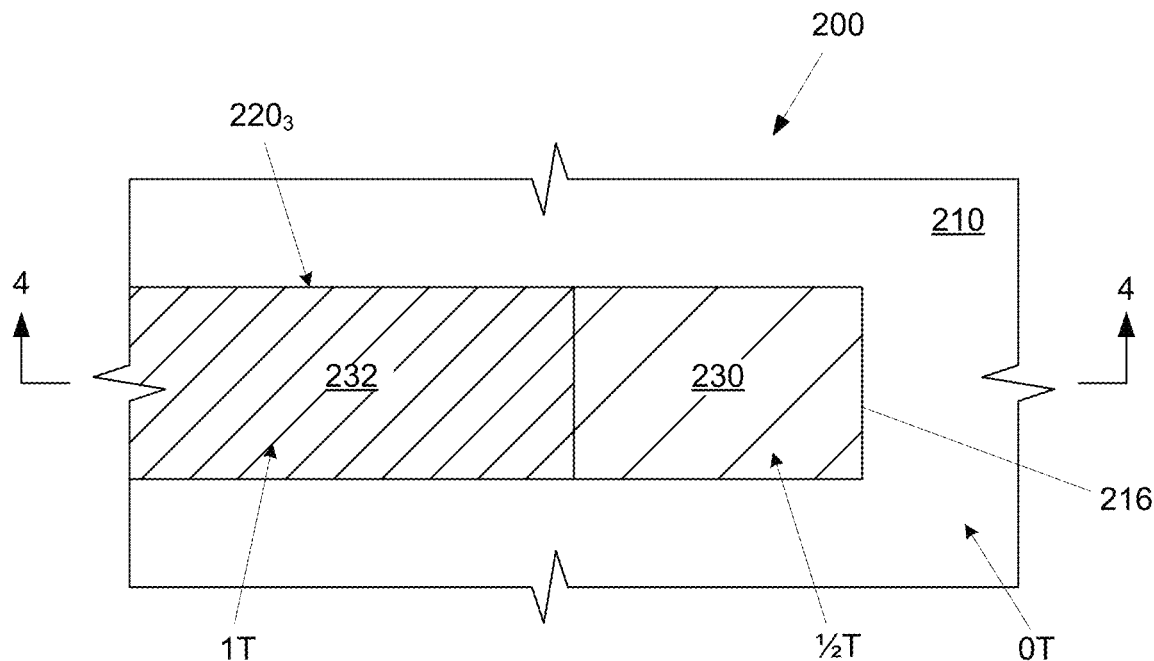
FIG. 3 is a top plan view of inset A of FIG. 2, according to an embodiment of the present description.
Figure 4:
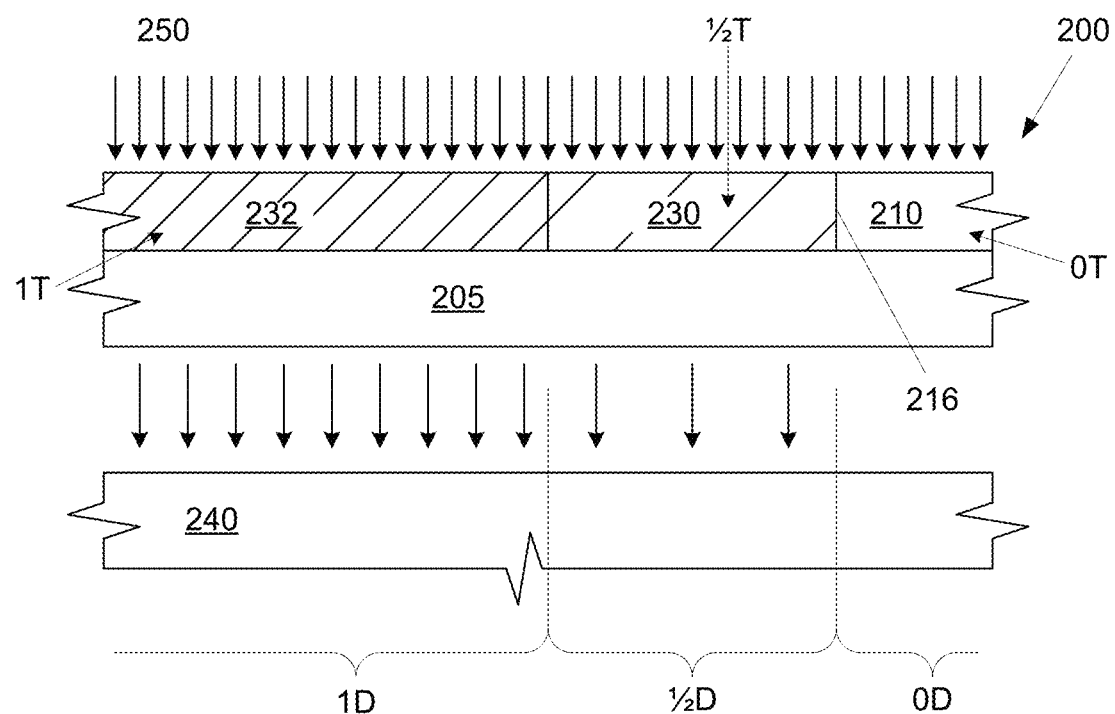
FIG. 4 is a side cross-sectional view of the reticle along line 4-4 of FIG. 3, where the reticle filters a light stream into a photoresist layer, according to one embodiment of the present description.

In one embodiments of the present description, as shown in FIGS. 2-5, exposure stitching may be used in conjunction with grayscale lithography. Grayscale lithography is a non-binary processing system wherein filters may be used to adjust the dose of light projecting through the lithographic reticle. As shown in FIG. 2-4, a lithographic reticle 200 may be formed comprising a substantially transparent substrate 205 (see FIG. 4) and a substantially opaque mask 210 formed on the having at least one exposure window (illustrated in FIG. 2 as a first exposure window $220_1$, a second exposure window $220_2$, a third exposure window 2203, and a fourth exposures window $220_4$, but may be referred to collectively or generically as exposure window 220). The exposure windows (shown as third exposure window $220_3$) may have a first end 216 and an opposing second end 218. As shown in FIG. 2, the least one of the exposure windows (shown as third exposure window $220_3$) may include a first filter 230 abutting the first end 216, a second filter 232 adjacent the first filter 230, and a third filter 234 abutting the second end 218 and adjacent the second filter 232.

The substantially opaque mask 210 may be any appropriate material, including, but not limited to chromium, metal oxide, organic polymer, and the like. The first filter 230, the second filter 232, and the third filter 234 may be any appropriate light filtering material, including but not limited to chromium, quartz, metal oxide, polymer, and the like. In a specific embodiment, the first filter 230 is semitransparent having a transmissivity between about 9% and 25%. In a specific embodiment, the second filter 232 is semitransparent having a transmissivity between about 18% and 50%. In a specific embodiment, the third filter 234 is highly transmissive having a transmissivity between about 90% and 100%.

Figure 5:
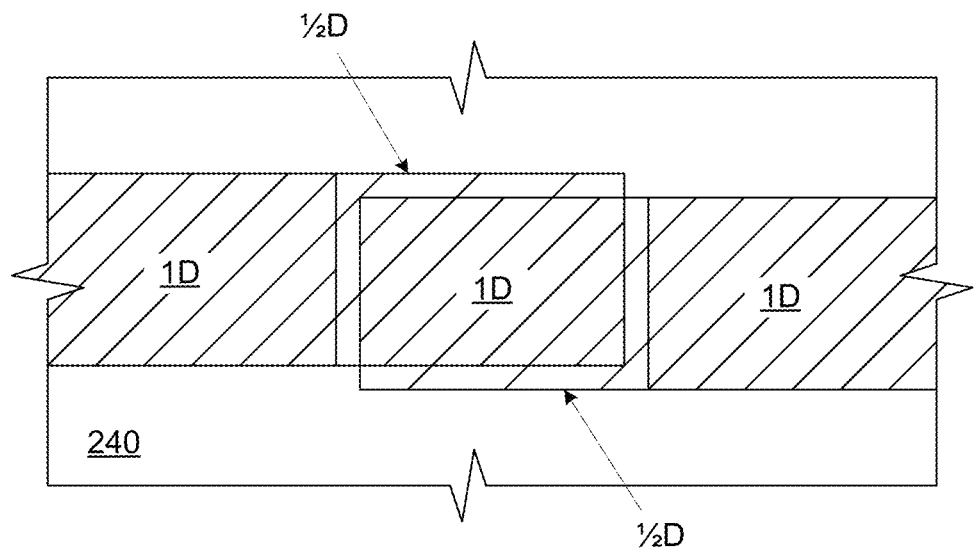
FIG. 5 is a top plan view of a stitch overlap dosing of a solder resist using reticle of the embodiment of FIG. 4, according to an embodiment of the present description.

In one embodiment shown in FIGS. 3-5, the first filter 230 may be used to deliver a correct light dose for exposure stitching. In other words, the first filter 230 may be used to accommodate the superposition of two exposures from two reticles in an overlap region. In an embodiment shown in FIG. 4 which is a cross-sectional view along line 4-4 for FIG. 3, a light source 250 (arrows), such as ultraviolet light, may be projected at the lithographic reticle 200. The second filter 232 has a light transmissivity 1T that delivers a dose 1D of light to a photoresist layer 240, thereby altering the physical characteristics of the photoresist layer 240. The first filter 230 has an average light transmissivity ½T that delivers about one-half the dose ½D of the dose 1D of the second filter 232. The substantially opaque mask 210 has a light transmissivity 0T of substantially zero and, thus, blocks the light source 250 from the photoresist layer 240, thus delivering no or zero dose 0D. As will be understood, mirror of the lithographic reticle 200 of FIG. 4 is positioned and exposed to overlap the exposures of the first filters 230 in the stitch region 130 (see FIG. 1). Thus, where the overlap occurs, the photoresist layer 240 may receive the dose 1D which is substantially the same as the dose 1D delivered by the second filter 232, such that is has substantially the same physical characteristics thereof. However, where perfect overlap cannot be achieved, the areas (½D of FIG. 5) of no overlap will receive an unintended underexposure. Due to the fact that the intensity cut-off at the lithography edge is not abrupt, the under-exposure will be minimized and considering the typical registration capabilities of lithography tools should not pose issues with the embodiments of the present description. However, if the underexposure is a problem, it may be corrected by changes to the lithographic process, such as by flood exposure or longer developer residence time, as will be understood to those skilled in the art.

The photoresist layer 240 may be any appropriate photosensitive material, including, but not limited to, positive photoresist materials. Such positive photoresist materials may include diazo naphthoquinone in a phenol formaldehyde resin, acrylic and methacrylic polymers activated with photoacid generator molecules and light-sensitive sensitizer polyimides, and the like. As will be understood to those skilled in the art, the photoresist layer 240 may also be negative photoresist materials.

Figure 6:
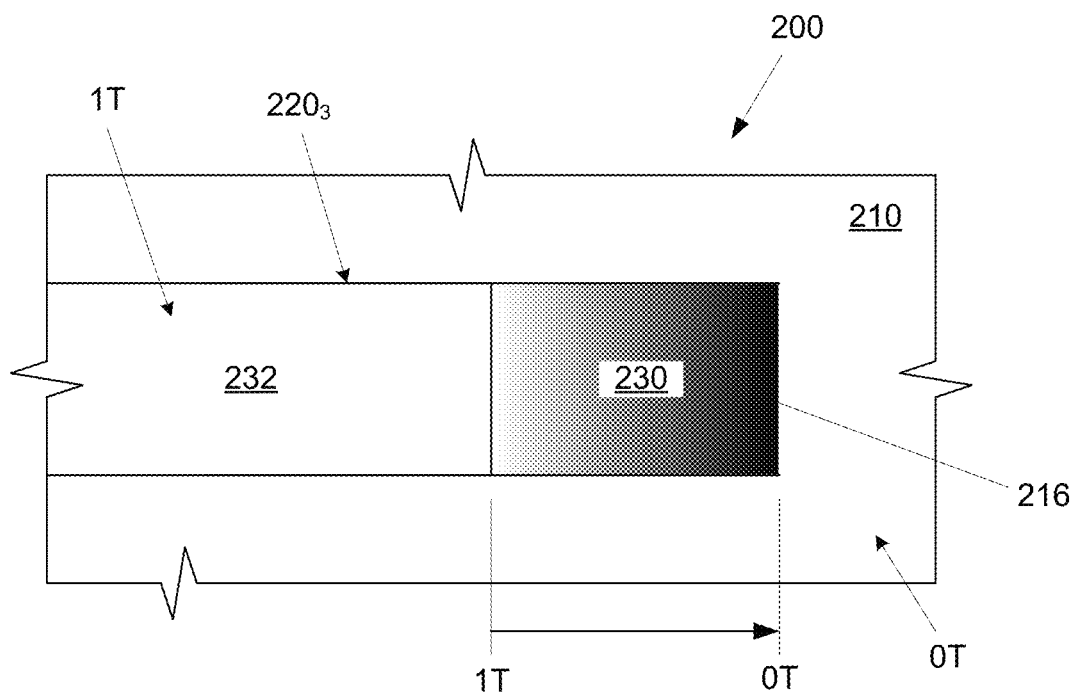
FIG. 6 is a top plan view of inset A of FIG. 2, according to another embodiment of the present description.
Figure 7:
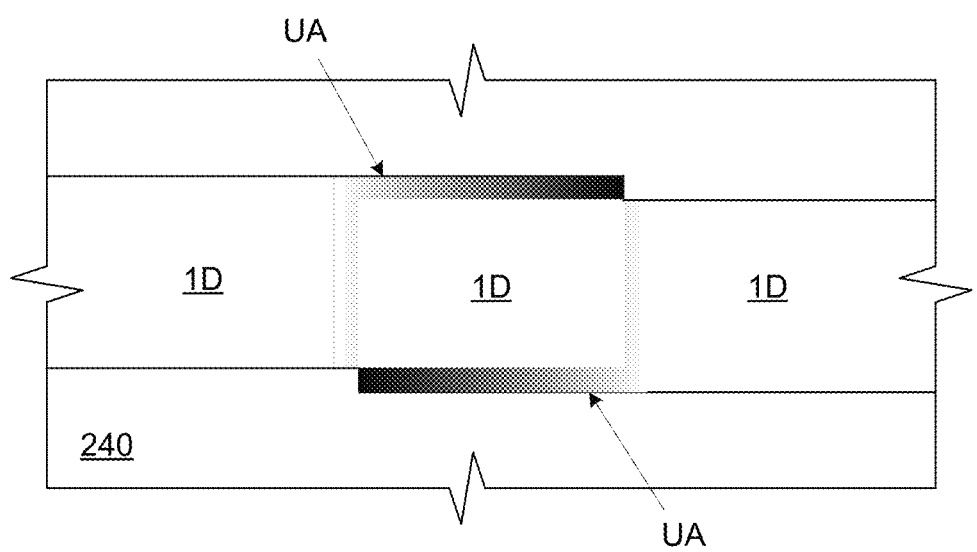
FIG. 7 is a top plan view of a stitch overlap dosing of a solder resist using reticle of the embodiment of FIG. 6, according to an embodiment of the present description.

FIGS. 6 and 7 illustrate another embodiment of the present invention. As shown in FIG. 6, the first filter 230 has a transmissivity that is gradated, wherein the first filter 230 begins with a light transmissivity 1T that is equal to the light transmissivity 1T of the second filter 232, such that the dose 1D is delivered, as discussed with regard to FIG. 4, and is gradated to end at the first end 216 of the exposure window $220_3$ with a light transmissivity of zero (e.g. opaque) that delivers no or a zero dose 0D, as discussed with regard to FIG. 4. Thus, the average light transmissivity of the first filter 230 will be about one half the transmissivity 1T of the second filter 232. As will be understood, a mirror of the lithographic reticle 200 of FIG. 6 is positioned and exposed to overlap the exposures of the first filters 230 in the stitch region 130 (see FIG. 1). Thus, where the overlap occurs, the photoresist layer 240 may receive the dose 1D which is substantially the same as the dose 1D delivered by the second filter 232. However, where perfect overlap cannot be achieved, the areas UA will receive an unintended underexposure, but the amount of underexposure may be reduced and the transition may be less apparent compared to the embodiments represented by FIGS. 3-5. In one embodiment, the first filter 230 may be linearly gradated.

Referring back to FIG. 1, embodiments of the present description may further include the formation of the zero-misalignment via portions 114 (described in, for example, U.S. Pat. No. 9,713,264), which is enabled by the lithographic reticle 200 are shown in FIG. 2. As will be understood to those skilled in the art, the interconnection structures 110 formed with a zero-misalignment via process may be advantageous over traditional fabrication techniques, as zero-misalignment vias can be patterned with fewer lithography steps, which may reduce costs. Furthermore, since the alignment between the zero-misalignment via portion 114 and the trace portion 112 of the interconnection structure 110 (see FIG. 1) is fixed on the lithographic reticle 200, effects of substrate warping/expanding on alignment are substantially eliminated, as will be understood to those skilled in the art.

Figure 8:
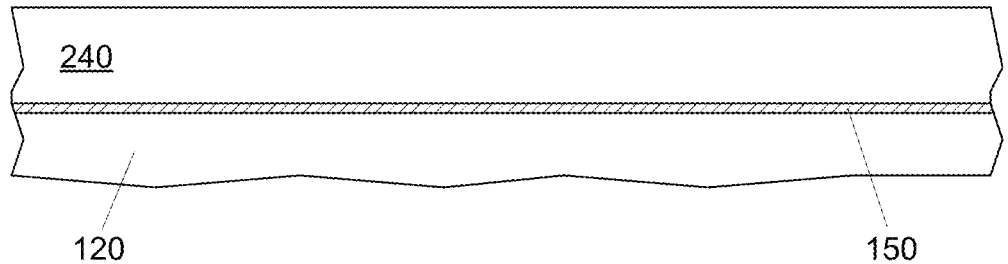
FIG. 8-17 are side cross-sectional views of a process for forming an interconnection structure, according to one embodiment of the present description.
Figure 9:
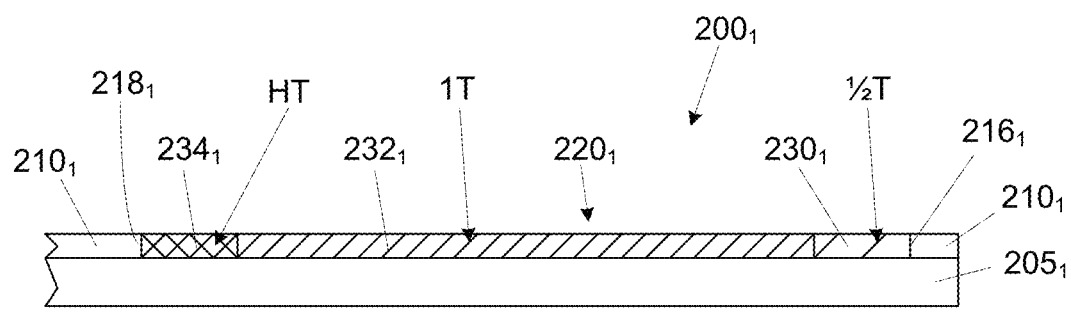
Figure 9:
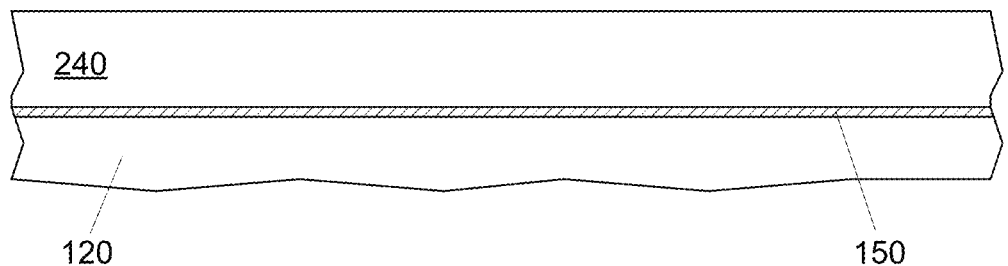
Figure 10:
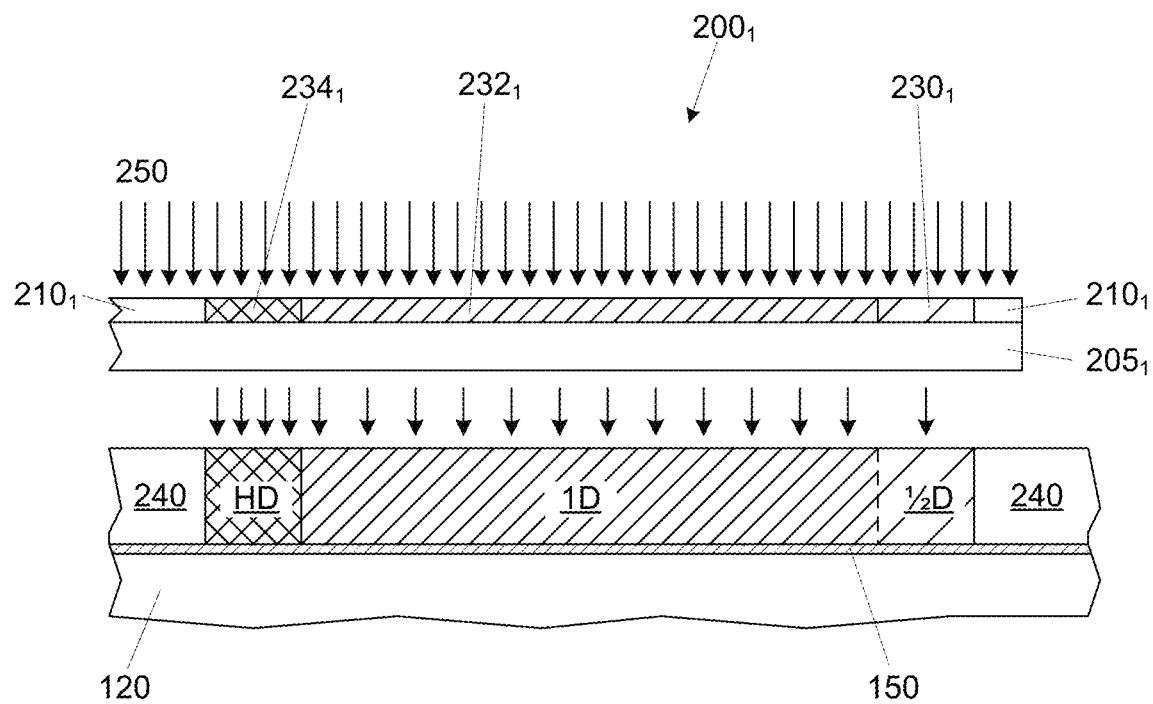

FIGS. 8-17 illustrates a process for fabrication of the interconnection structure 110 (see FIG. 1), which includes the zero misalignment via portion 114 and the trace portion 112, wherein the trace portion includes the stitch region 130. As shown in FIG. 8, the electronic substrate 120 may be provided having a seed layer 150 formed thereon, wherein the seed layer 150 has the photoresist layer 240 formed thereon. The seed layer 150 may be any appropriate metal that may be used to plate a metal for the formation of the interconnection structure 110, as will be discussed. As shown in FIG. 9, a first lithographic reticle $200_1$ may be positioned over the photoresist layer 240. The first lithographic reticle $200_1$ may comprise a transparent substrate $205_1$ and the substantially opaque mask $210_1$ including the exposure window $220_1$ formed therein, wherein the exposure window $220_1$ has the first end $216_1$ and the opposing second end $218_1$. The exposure window $220_1$ may further include the first filter $230_1$ abutting the first end $216_1$, the second filter $232_1$ adjacent the first filter $230_1$, and the third filter $234_1$ abutting the second end $218_1$ and adjacent the second filter $232_1$. As shown in FIG. 10, the light source 250 (arrows) may be projected at the first lithographic reticle $200_1$, such that the second filter $232_1$, having a transmissivity 1T, delivers a dose 1D of light to the photoresist layer 240, the first filter $230_1$, having a transmissivity ½T that is about one half the transmissivity 1T of the second filter $232_1$, delivers about one-half the dose ½D of the dose 1D of the second filter $232_1$ to the photoresist layer 240, and the third filter $234_1$, having a high transmissivity HT, delivers a high dose HD of light to the photoresist layer 240, wherein the high dose HD is higher than that of the dose 1D delivered by the second filter $232_1$. It is understood that the substantially opaque mask $210_1$ blocks the light source 250 to the photoresist layer 240, thus delivering no or zero dose 0D.

Figure 11:
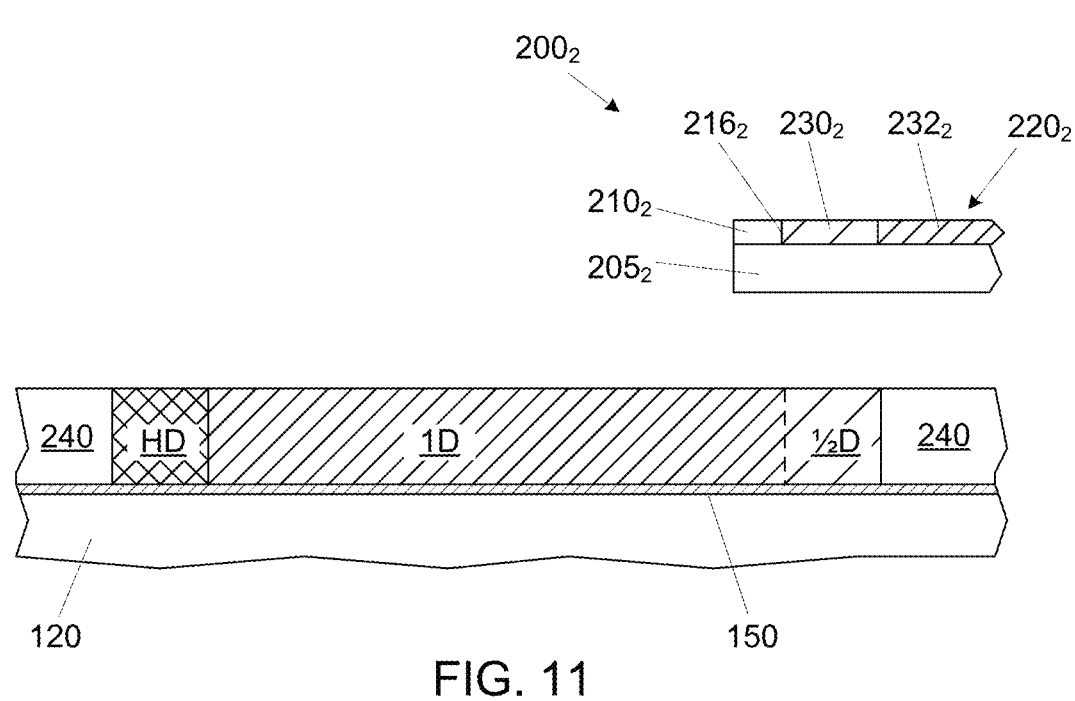
Figure 12:
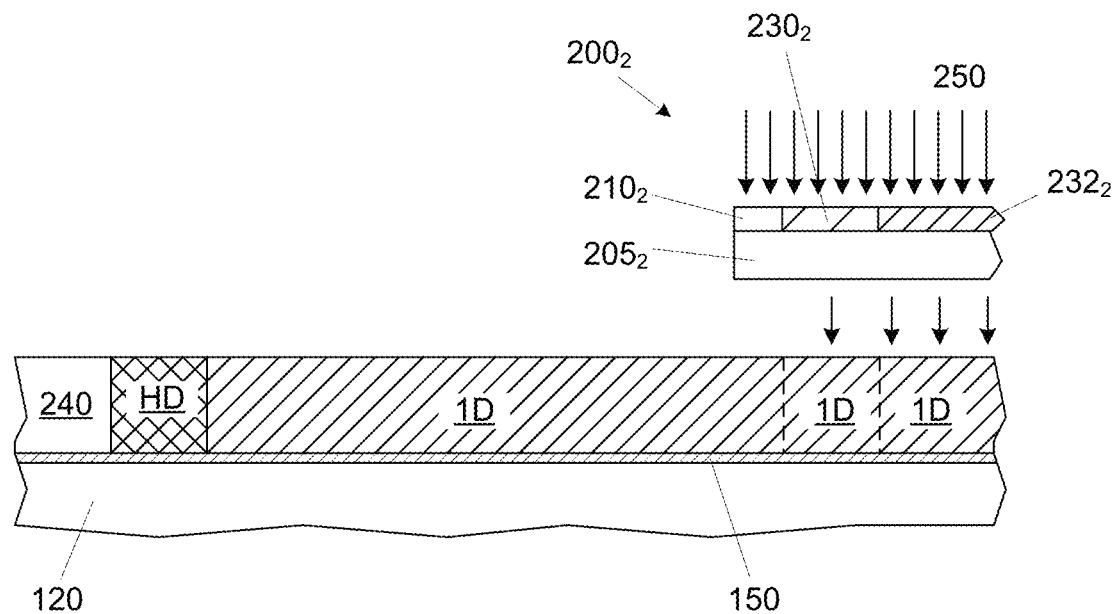

As shown in FIG. 11, the first lithographic reticle $200_1$ (see FIG. 10) may be removed and a second lithographic reticle $200_2$ may be positioned over the photoresist layer 240. The second lithographic reticle $200_2$ may comprise a substantially opaque mask $210_2$ including an exposure window $220_2$ formed therein, wherein the exposure window $220_2$ has the first end $216_2$. The exposure window $220_2$ may further include the first filter $230_2$ abutting the first end $216_2$ and the second filter $232_2$ adjacent the first filter $230_2$. The first filter $230_2$ for the second lithographic reticle $200_2$ may be a mirror image of the first filter $230_2$ of the first lithographic reticle $200_1$ and may be aligned over the area of the photoresist layer 240 where the first filter $230_1$ of the first lithographic reticle $200_1$ delivered one-half the dose ½D to the photoresist layer 240. As shown in FIG. 12, the light source 250 (arrows) may be projected at the second lithographic reticle $200_2$, such that the second filter $232_2$ delivers a dose 1D of light to the photoresist layer 240 and the first filter $230_2$ delivers about one-half the dose ½D of the dose 1D of the second filter $232_2$ to the photoresist layer 240, such that the combination of the dose ½D from the first filter $230_1$ of the first lithographic reticle $200_1$ and the dose ½D from the first filter $230_2$ of the second lithographic reticle $200_2$ results in the receiving the dose 1D which is substantially the same as the dose 1D delivered by the second filter $232_1$ from the first lithographic reticle $200_1$ or as the dose 1D delivered by the second filter $232_2$ from the second lithographic reticle $200_2$, and resulting in the same physical characteristics thereof. The overlapping area is the stitch region 130, as shown in FIG. 1.

Figure 13:
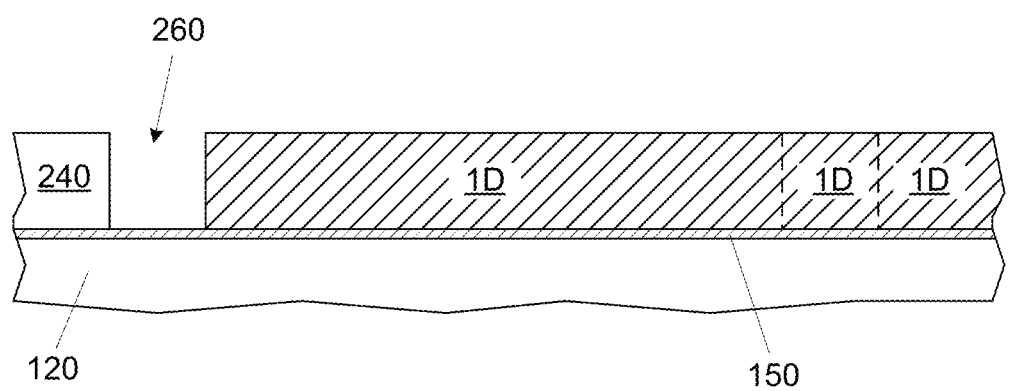
Figure 14:
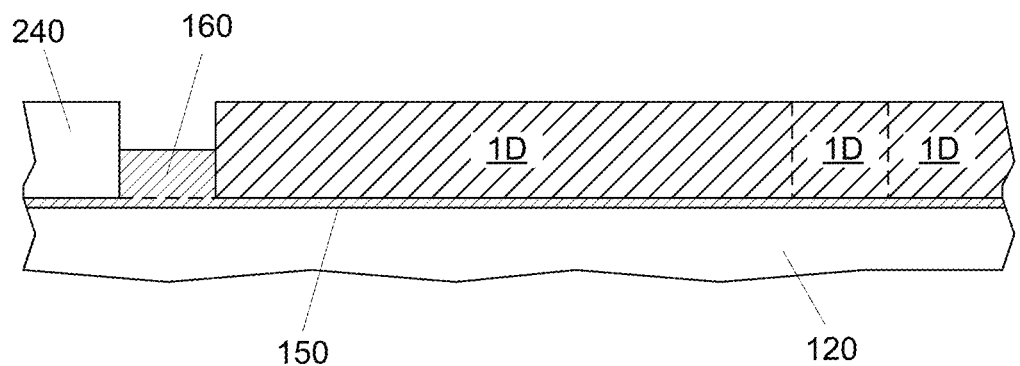
Figure 15:
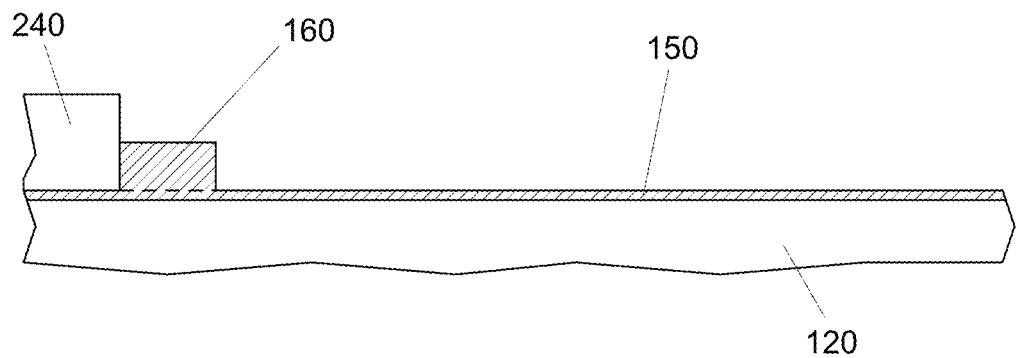
Figure 16:
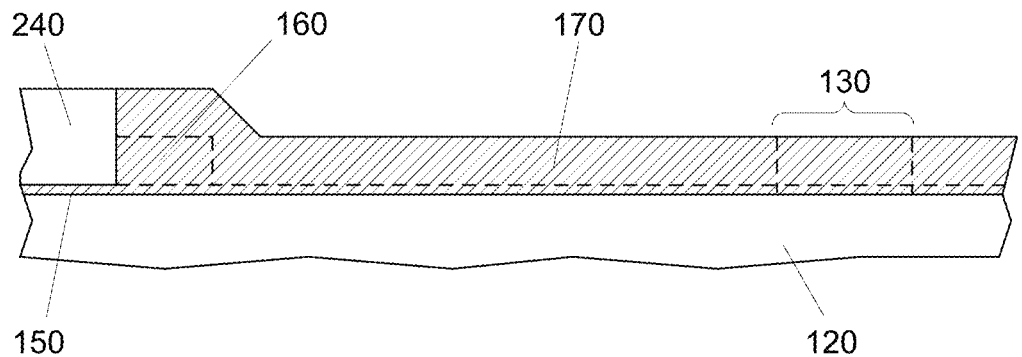
Figure 17:
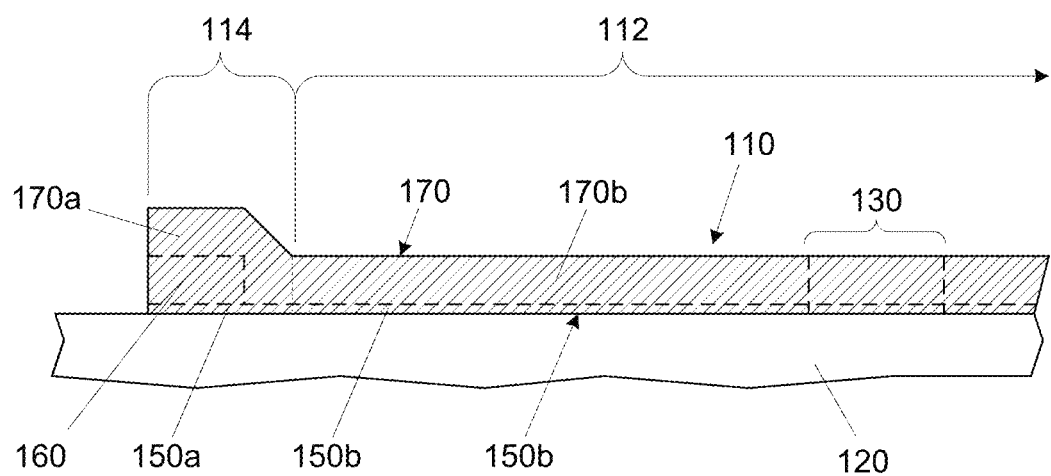

As shown in FIG. 13, the high dose HD portion of the photoresist layer 240 of FIG. 12 may be removed without affecting the reminder of the photoresist layer 240, since due the different dosing levels, the high dose HD portion will have distinct physical characteristics (e.g. more susceptible to dissolve in an etching solution than the reminder of the photoresist layer 240). As shown in FIG. 13, the removal of the high dose HD portion of the photoresist layer 240 of FIG. 12 results in an opening 260 that exposes a portion of the seed layer 150. As shown in FIG. 14, a conductive material may be formed, such as by plating, on the exposed seed layer 150 to form a conductive pad 160. As shown in FIG. 15, the portion of the photoresist layer 240 having the dose 1D may be removed, such as by selective etching, to expose another portion of the seed layer 150. As shown in FIG. 16, a conductive material layer 170 may be formed, such as by plating, on the seed layer 150 and the conductive pad 160 (see FIG. 15). As shown in FIG. 17, any portion of the photoresist layer 240 and the seed layer 150 not utilized may be removed, such as by etching, to form the interconnection structure 110. As will be seen in FIG. 17, the elevated portion of the interconnection structure 110 may be referred to as the zero-misalignment via portion 114, which may comprise a first portion 150*a* of the seed layer 150, the conductive pad 160, and a first portion 170*a* of the conductive material layer 170, and the remainder of the interconnection structure 110 may be referred to as the trace portion 112, which may comprise a second portion 150*b* of a seed layer 150 and a second portion 170*b* of the metal material layer 170, as previously discussed.

The seed layer 150, the conductive pad 160, and the conductive material layer 170 may be made of any appropriate conductive material, including but not limited to, metals, such as copper, silver, nickel, gold, tungsten, tantalum, titanium, hafnium, zirconium, tin, and aluminum, alloys thereof, carbides thereof, and combinations thereof. In a specific embodiment, the seed layer 150, metal layer 160, and the metal material 170 may be copper.

Although the embodiments of the present description may be directed at a stitching process that uses complimentary reticles that are split as substantially 50%/50% light dose delivery, the present description is not so limited. It is understood that the dosing split could be any reasonable percentage, so long as the combination of doses is substantially dose 1D.

Figure 18:
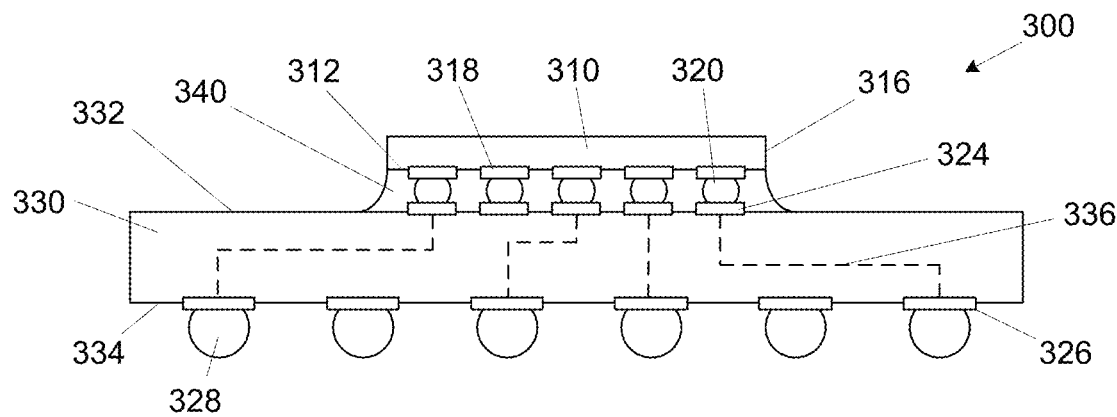
FIG. 18 is a side cross-sectional view of an integrated circuit package, according to an embodiment of the present description.

In a further embodiment of the present description, as shown in FIG. 18, the interconnection structures 110 (see FIG. 1) discussed above may be used in the fabrication of an integrated circuit package 300. The integrated circuit package 300 may include at least one integrated circuit device 310, such as a microprocessor, a chipset, a graphics device, a wireless device, a memory device, an application specific integrated circuit, or the like, attached to an electronic interposer 330 through a plurality of device-to-interposer interconnects 320. The device-to-interposer interconnects 320 may extend between bond pads 318 on an active surface 312 of the integrated circuit device 310 and corresponding bond pads 324 on a first surface 332 of the electronic interposer 330, in a configuration generally known as a flip-chip or controlled collapse chip connection ("C4") configuration. The integrated circuit device bond pads 318 may be in electrical communication with integrated circuitry (not shown) within the integrated circuit device 310. The electronic interposer bond pads 324 may be in electrical communication with conductive routes 336 within the electronic interposer 330. The electronic interposer 330 may comprise a plurality of dielectric layers (not shown) having the plurality of conductive routes 336 formed from conductive traces (not shown) formed on the dielectric layers (not shown) that at connected with conductive vias (not shown) formed through the dielectric layers (not shown). The processes and materials use for forming the electronic interposer 330 are well known in the art, and, for the sake of brevity and conciseness, will not be described or illustrated herein. At least one of the conductive routes 336 of the electronic interposer 330 may include at least one interconnection structure 110 (see FIG. 1) of the embodiments previously discussed. The conductive routes 336 may provide electrical communication routes between the integrated circuit device 310 on the electronic interposer 330 and/or to other components (not shown), and may provide electrical communication routes to attachment bond pads 326 on a second surface 334 of the electronic interposer 330 for attachment to a microelectronic board (not shown). External interconnects 328 may be attached to the attachment bond pads 326.

As also shown in FIG. 18, an electrically-insulating underfill material 340 may be formed between the integrated circuit device 310 and the electronic interposer 330, and around the device-to-interposer interconnects 320. The underfill material 340 may be used to overcome the mechanical stress issues that can arise from thermal expansion mismatch between the integrated circuit device 310 and the electronic interposer 330, thereby enhancing the reliability of the device-to-interposer interconnects 320. The underfill material 340 may be an epoxy material that has sufficiently low viscosity to be wicked between the integrated circuit device 310 and the electronic interposer 330 by capillary action when introduced by an underfill material dispenser (not shown) along at least one side 316 of the integrated circuit device 310, which will be understood to those skilled in the art.

The electronic interposer 330 may comprise any appropriate dielectric material, including, by not limited to, build-up films (e.g. filled organic materials, such as silicon dioxide filed epoxide), liquid crystal polymer, epoxy resin, bismaleimide triazine resin, FR4, polyimide materials, and the like. The conductive routes 336 may be formed of any appropriate conductive material, including, but not limited to, copper, silver, gold, nickel, and alloys thereof. It is understood that the electronic interposer 330 may be formed from any number of dielectric layers and may contain active and/or passive electronic devices (not shown) formed therein. It is further understood that the conductive routes 336 could form any desired electrical route within the electronic interposer 330 and/or with additional external components (not shown). It is also understood that solder resist layers (not shown) could be utilized on the electronic interposer first surface 332 and/or the electronic interposer second surface 334, as will be understood to those skilled in the art. The processes used for forming the electronic interposer 330 are well known to those skilled in the art, and for the sake of brevity and conciseness will not be described or illustrated herein.

The device-to-interposer interconnects 320 and the external interconnects 328 can be made from any appropriate material, including, but not limited to, solder materials and conductive filled epoxies. Solder materials may include any appropriate material, including but not limited to, lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys.

Figure 19:
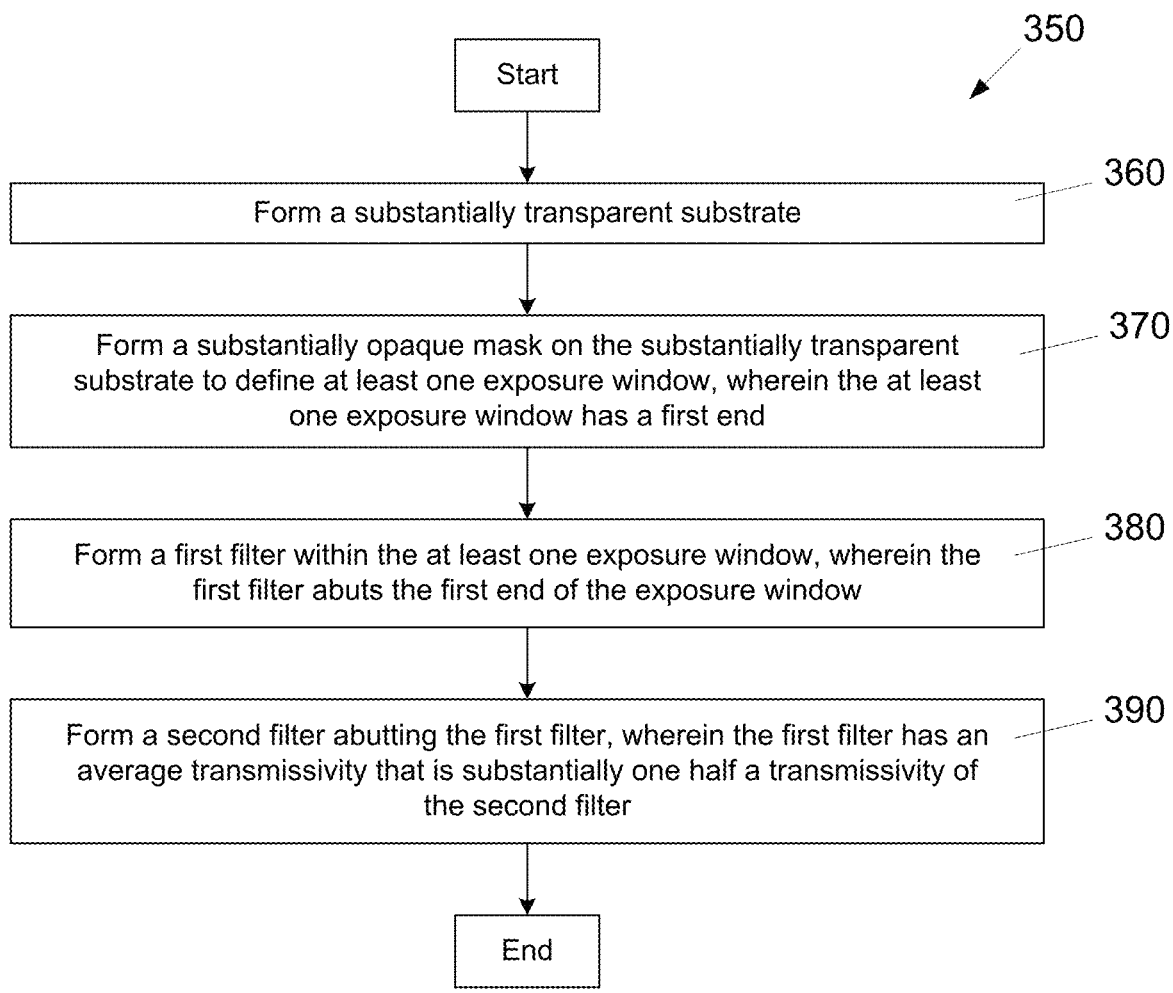
FIG. 19 is a flow diagram of a method of fabricating a lithographic reticle, according to one embodiment of the present description.

FIG. 19 is a flow chart of a process 350 of fabricating a lithographic reticle according to an embodiment of the present description. As set forth in block 360, a substantially transparent substrate may be formed. A substantially opaque mask may be formed on the substantially transparent structure to define at least one exposure window, wherein the at least one exposure window has a first end, as set forth in block 370. As set forth in block 380, a first filter may be formed within the at least one exposure window, wherein the first filter abuts the first end of the exposure window. A second filter may be formed abutting the first filter, wherein the first filter has an average transmissivity that is substantially one half a transmissivity of the second filter, as set forth in block 390.

Figure 20:
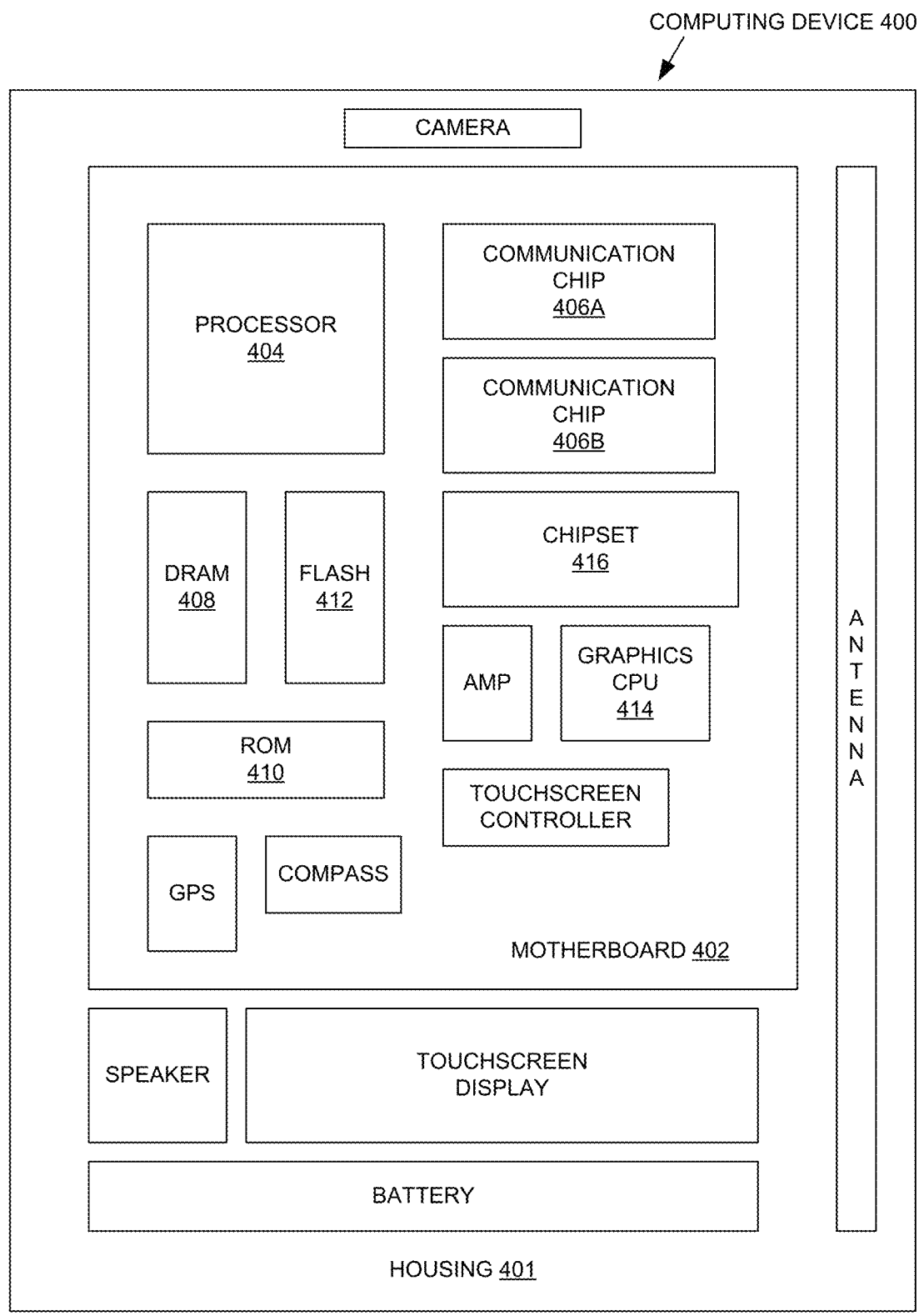
FIG. 20 is an electronic system, according to one embodiment of the present description.

FIG. 20 illustrates an electronic or computing device 400 in accordance with one implementation of the present description. The computing device 400 may include a housing 401 having a board 402 disposed therein. The computing device 400 may include a number of integrated circuit components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip or device may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit package including an interconnection structure comprising a via portion comprising a first portion of a seed layer, a conductive pad on the first portion of the seed layer, and a first portion of a conductive material layer on the conductive pad; and a trace portion comprising a second portion of the conductive material layer on a second portion of the seed layer; wherein the trace portion includes a stitch region.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-20. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is a lithographic reticle, comprising a transparent substrate; a substantially opaque mask forming at least one exposure window on the transparent substrate, wherein the at least one exposure window has a first end; a first filter formed on the transparent substrate within the at least one exposure window and abutting the first end; and a second filter formed on the transparent substrate within the at least one exposure window and abutting the first filter; wherein an average transmissivity of the first filter is substantially one half a transmissivity of the second filter.

In Example 2, the subject matter of Example 1 can optionally include the transmissivity of the first filter being gradated.

In Example 3, the subject matter of Example 2 can optionally include the first filter having a transmissivity that is substantially equal to the transmissivity of the second filter where the first filter abuts the second filter and is graded to substantially no transmissivity where the first filter abuts the first end of the exposure window.

In Example 4, the subject matter of any of Examples 1 to 3 can optionally include a third filter, wherein the third filter is adjacent the second filter.

In Example 5, the subject matter of Example 4 can optionally include the at least one exposure window having a second end opposing the first end, and wherein the third filter abuts the second end of the exposure window.

In Example 6, the subject matter of any of Examples 4 and 5 can optionally include the third filter having a transmissivity greater than the transmissivity of the second filter.

Example 7 is a method of fabricating a lithographic reticle, comprising forming a transparent substrate; forming a substantially opaque mask on the transparent structure to define at least one exposure window, wherein the at least one exposure window has a first end; forming a first filter within the at least one exposure window, wherein the first filter abuts the first end of the exposure window; and forming a second filter abutting the first filter; wherein an average transmissivity of the first filter is substantially one half a transmissivity of the second filter.

In Example 8, the subject matter of Example 7 can optionally include forming the first filter comprising forming the first filter having a gradated transmissivity.

In Example 9, the subject matter of Example 8 can optionally include forming the first filter having a gradated transmissivity comprising forming the first filter having a transmissivity that is substantially equal to the transmissivity of the second filter where the first filter abuts the second filter and is gradated to substantially no transmissivity where the first filter abuts the first end of the exposure window.

In Example 10, the subject matter of any of Examples 7 to 9 can optionally include forming a third filter adjacent to the second filter.

In Example 11, the subject matter of Example 10 can optionally include the at least one exposure window having a second end opposing the first end, and wherein the third filter abuts the second end of the exposure window.

In Example 12, the subject matter of any of Examples 10 to 11 can optionally include the third filter having a transmissivity greater than the transmissivity of the second filter.

Example 17 is an interconnection structure comprising a via portion comprising a first portion of a seed layer, a conductive pad on the first portion of the seed layer, and a first portion of a conductive material layer on the conductive pad; and a trace portion comprising a second portion of the conductive material layer on a second portion of the seed layer; wherein the trace portion includes a stitch region; and at least one integrated circuit device electrically attached to the interposer.

In Example 18, the subject matter of Example 17 can optionally include at least one of the seed layer, the conductive pad, and the conductive material layer comprising a metal.

In Example 19, the subject matter of Example 18 can optionally include the metal being selected from the group consisting of copper, silver, nickel, gold, tungsten, tantalum, titanium, hafnium, zirconium, tin, and aluminum, alloys thereof, carbides thereof, and combinations thereof.

In Example 20, the subject matter of Example 17 can optionally include at least one of the seed layer, the conductive pad, and the conductive material layer comprising copper.

Example 17 is an electronic system, comprising a board and an integrated circuit package electrically attached to the board, wherein the integrated circuit package comprises an electronic interposer, including at least one interconnection structure comprising: a via portion comprising a first portion of a seed layer, a conductive pad on the first portion of the seed layer, and a first portion of a conductive material layer on the conductive pad; and a trace portion comprising a second portion of the conductive material layer on a second portion of the seed layer; wherein the trace portion includes a stitch region; and at least one integrated circuit device electrically attached to the interposer.

In Example 18, the subject matter of Example 17 can optionally include at least one of the seed layer, the conductive pad, and the conductive material layer comprising a metal.

In Example 19, the subject matter of Example 18 can optionally include the metal being selected from the group consisting of copper, silver, nickel, gold, tungsten, tantalum, titanium, hafnium, zirconium, tin, and aluminum, alloys thereof, carbides thereof, and combinations thereof.

In Example 20, the subject matter of Example 17 can optionally include at least one of the seed layer, the conductive pad, and the conductive material layer comprising copper.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A lithographic reticle, comprising:
   a transparent substrate;
   a substantially opaque mask on the transparent substrate, wherein the substantially opaque mask includes at least one exposure window and wherein the at least one exposure window has a first end;
   a first filter on the transparent substrate within the at least one exposure window and abutting the first end thereof;
   a second filter on the transparent substrate within the at least one exposure window and abutting the first filter; and
   a third filter on the transparent substrate within the at least one exposure window and abutting the second filter;
   wherein an average transmissivity of the first filter is substantially one half a transmissivity of the second filter, wherein the third filter has a transmissivity greater than the transmissivity of the second filter, and wherein the second filter is positioned between the first filter and the third filter.

2. The lithographic reticle of claim 1, wherein the transmissivity of the first filter is gradated.

3. The lithographic reticle of claim 2, wherein the first filter has a transmissivity that is substantially equal to the transmissivity of the second filter where the first filter abuts the second filter and is gradated to substantially no transmissivity where the first filter abuts the first end of the exposure window.

4. The lithographic reticle of claim 1, whether the at least one exposure window has a second end opposing the first end, and wherein the third filter abuts the second end of the exposure window.

5. A method of fabricating a lithographic reticle, comprising:
   forming a transparent substrate;
   forming a substantially opaque mask on the transparent structure;
   forming at least one exposure window in the substantially opaque mask, wherein the at least one exposure window has a first end;
   forming a first filter within the at least one exposure window, wherein the first filter abuts the first end of the exposure window; and
   forming a second filter abutting the first filter;
   forming a third filter adjacent to the second filter;
   wherein the first filter has an average transmissivity that is substantially one half a transmissivity of the second filter, wherein the third filter has a transmissivity greater than the transmissivity of the second filter, and wherein the second filter is positioned between the first filter and the third filter.

6. The method of claim 5, wherein forming the first filter comprises forming the first filter having a gradated transmissivity.

7. The method of claim 6, wherein forming the first filter having a gradated transmissivity comprises forming the first filter have a transmissivity that is substantially equal to the transmissivity of the second filter where the first filter abuts the second filter and is gradated to substantially no transmissivity where the first filter abuts the first end of the exposure window.

8. The method of claim 5, whether the at least one exposure window has a second end opposing the first end, and wherein the third filter abuts the second end of the exposure window.

* * * * *